United States Patent
Yang et al.

(10) Patent No.: US 6,750,129 B2
(45) Date of Patent: Jun. 15, 2004

(54) PROCESS FOR FORMING FUSIBLE LINKS

(75) Inventors: Gwo-Shii Yang, Hsinchu (TW); Jen Kon Chen, Hsin-Chu (TW); Hsueh-Chung Chen, Yunghe (TW); Hans-Joachim Barth, Munich (DE); Chiung-Sheng Hsiung, Kaohsiung (TW); Chih-Chien Liu, Taipei (TW); Tong-Yu Chen, Hsinchu (TW); Yi-hsiung Lin, Wappingers Falls, NY (US); Chih-Chao Yang, Beacon, NY (US)

(73) Assignee: Infineon Technologies AG, Munich (DE)

( * ) Notice: Subject to any disclaimer, the term of this patent is extended or adjusted under 35 U.S.C. 154(b) by 23 days.

(21) Appl. No.: 10/292,399

(22) Filed: Nov. 12, 2002

(65) Prior Publication Data
US 2004/0092091 A1 May 13, 2004

(51) Int. Cl.$^7$ .......................................... H01L 21/3205
(52) U.S. Cl. ........................................ 438/601; 257/529
(58) Field of Search ................................. 438/131–132, 438/215, 281, 333, 467, 601, 612, 622, 624, 637, 661, 675; 257/529

(56) References Cited

U.S. PATENT DOCUMENTS 6,124,194 A * 9/2000 Shao et al. ................. 438/600
6,180,503 B1 * 1/2001 Tzeng et al. ............... 438/601

OTHER PUBLICATIONS

"Process for Forming Fusible Links", U.S. Ser. No. 09/894,337, filed on Jan. 17, 2001.

* cited by examiner

Primary Examiner—David Nelms
Assistant Examiner—David Vu
(74) Attorney, Agent, or Firm—Jackson Walker L.L.P.

(57) ABSTRACT

A process for forming fusible links in an integrated circuit in which the fusible links are formed in the final metallization layer simultaneously with bonding pads. The process can be applied in the fabrication of integrated circuits that employ copper metallization and low k dielectric materials. After patterning the final metal (aluminum) layer to form the fusible links and the bonding pads, a dielectric etch stop layer is formed over the final metal layer before a passivation layer is deposited. The passivation layer is removed in areas over the fusible links and the bonding pads. The dielectric etch stop layer is removed either from above the bonding pads only, or from above both the bonding pads and the fusible links.

27 Claims, 4 Drawing Sheets

PROCESS FOR FORMING FUSIBLE LINKS

FIELD OF THE INVENTION

This invention relates to a process for forming an integrated circuit, and more particularly, to a process for forming fusible links in an integrated circuit.

DESCRIPTION OF THE RELATED ART

As device generation goes beyond the 0.25 μm rules, integrated circuits are transitioning from aluminum to copper metal interconnects. At the sane time, low dielectric constant (low k) materials have been proposed to replace silicon oxide as the primary material for dielectric insulation layers. Low k materials, which are typically polymers and have dielectric constant less than about 3.9 (the dielectric constant of silicon dioxide), reduce interconnect capacitance and crosstalk noise and enhance circuit performance. Some examples of low k dielectrics include polyimide, fluorocarbons, parylene, hydrogen silsequioxanes, and benzocyclobutenes. One method of fabricating integrated circuit using copper and low k dielectrics is a damascene process. In a damascene process, openings are provided in the low k dielectric layer that define the wiring patterns. The patterns are filled with a metallization metal using a filling technique. The metal may be planarized on the surface of the dielectric by removing excess metallization using a polishing method.

In integrated circuits having a large number of semiconductor devices fabricated on a silicon substrate, it is often necessary to provide conductors for connecting semiconductor devices with each other, as well as fusible links (fuses) that are coupled to conductors. The fuses may be opened (cut or blown) after fabrication. For example, in a memory circuit, fuses may be employed to replace defective memory arrays with redundant memory arrays. Fuses typical comprise metal links that can be explosively fused open by application of laser pulses or electrical pulses, which cause a portion of the link material to vaporize and/or melt. The integration of copper and low k dielectrics presents problems for the fabrication of integrated circuits having fusible links.

SUMMARY OF THE INVENTION

Accordingly, the present invention is directed to a process for forming a fusible link in an integrated circuit that substantially obviates one or more of the problems due to limitations and disadvantages of the related art.

An object of the present invention is to provide an improved fusible link that can be integrated with the newer materials being used in semiconductor manufacturing, and a process for fabricating the same.

Additional features and advantages of the invention will be set forth in the descriptions that follow and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a process for forming a fusible link in an integrated circuit, the process includes forming a final metal layer on a semiconductor substrate, wherein the substrate comprises devices fabricated from a copper metal layer and a low k dielectric material; patterning the final metal layer to form a fusible link that electrically connects the devices in the integrated circuit; forming a dielectric etch stop layer over the patterned final metal layer and the substrate; depositing a passivation layer over the dielectric etch stop layer over the fusible link; and removing the passivation layer over at least a portion of the fusible link and a surrounding area.

More specifically, the invention provides a process for forming a fusible link in an integrated circuit, the process comprising: (a) forming a second dielectric layer on a surface of an underlying metal interconnect layer and a first dielectric layer; (b) depositing an oxide layer at a thickness effective to prevent cracking of the oxide layer during a laser fuse process; (c) forming a via in the oxide layer and second dielectric layer extending to the underlying metal interconnect; (d) filling the via with a conductive material; (e) forming a final metal layer; (f) patterning the final metal layer to form a fusible link electrically connected to the via; (g) forming a dielectric etch stop layer over the patterned final metal layer and the oxide layer; (h) depositing a passivation layer over the dielectric etch stop layer; and (i) removing the passivation layer from above at least a portion of the fusible link and a surrounding area.

In another aspect, the present invention provides an article of manufacture comprising a semiconductor substrate having an integrated circuit formed thereon, the integrated circuit includes a fusible link formed according to the above process.

It is to be understood that both the foregoing general description and the following detailed description are exemplary and explanatory and are intended to provide further explanation of the invention as claimed.

DETAILED DESCRIPTION OF THE PREFERRED EMBODIMENTS

Fusible links in an integrated circuit (IC) are generally formed as a part of one of the metallization layers during fabrication of the IC. Conventionally, a lower level such as a polysilicon layer is used for this purpose. Since the laser energy required to blow the fuse depends on the thickness of the dielectric material abode the fuse, the dielectric layers above the fuse including the final passivation layer are typically partially removed prior to blowing the fuse with a laser. In some cases, the dielectric layers are removed entirely and replaced with a thinner protective layer. In other cases, the dielectric layers are etched down to a desired thickness. Meanwhile, the final passivation layer above the uppermost metallization layer must be opened over the bonding pad areas in that layer to provide access to the pads. This may also include etching an antireflection coating over the bonding pads. Thus, the fuse areas and the bonding pad areas impose different requirements on the final etching step. It has been difficult to control the final etching process to reduce over-etching or under-etching of the different areas.

A method for forming fusible links in the final metallization layer of the IC is described in a co-pending U.S. patent application Ser. No. 09/894,337, entitled "Process for forming fusible links" the disclosure of which is hereby incorporated by reference in its entirety. This method minimizes or eliminates corrosion and oxidation of the underlying copper metal regions due to exposure to the atmosphere. Further advantages of this method are described in the reference itself. This fabrication method is summarized herein with reference to FIGS. 1A–1F.

Figure 1A:
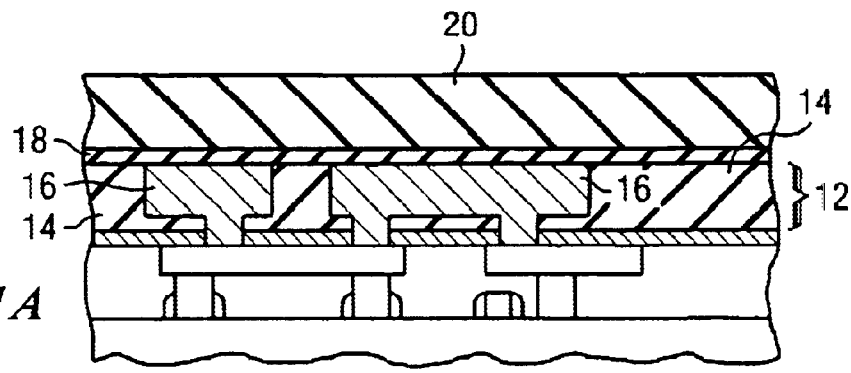
FIGS. 1A–1F illustrate a process for forming a fuse in an integrated circuit.

FIG. 1A shows a semiconductor substrate having a copper/low k wiring layer 12 formed thereon, sometimes referred to as the last copper level. Reference symbols 14 and 16 designate low k dielectric and copper, respectively. The term low k dielectrics generally refers to materials suitable for use in the manufacture of integrated circuits or the like and have a dielectric constant less than about 3.0. A preferred low k dielectric is a polymeric dielectric known under the trademark SILK® (dielectric constant 2.65), commercially available from the Dow Chemical Company. The layer 12 shown in this example is formed using a dual damascene process, and planarized to remove excess copper. Other suitable methods may also be used to form the layer 12. A thin dielectric cap layer 18 can be formed over the planarized surface, and an oxide layer 20 is then deposited (FIG. 1A). The dielectric cap layer 18, preferably of silicon nitride or silicon carbide, acts as a barrier against diffusion of copper between metal levels and also serves as an etch stop in a dielectric etch process. The oxide layer 20 should be thick enough to withstand the laser fuse process without cracking and exposing the underlying low k dielectric layer 10. Cracking of the oxide layer is deleterious since the formation of cracks exposes the underlying low k dielectric layer to the atmosphere. This can be problematic because low k dielectric layers have relatively high oxygen diffusivity constants compared to the more traditional materials such as silicon oxide, and exposure of a low k dielectric to the atmosphere can cause oxidation and/or corrosion of the embedded copper metal regions. Preferably, the oxide layer 20 is about 1 micron thick.

Figure 1B:
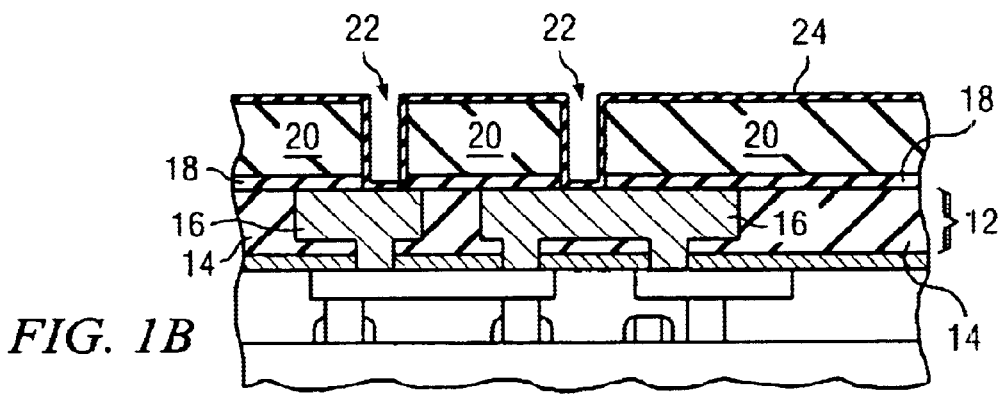
Figure 1C:
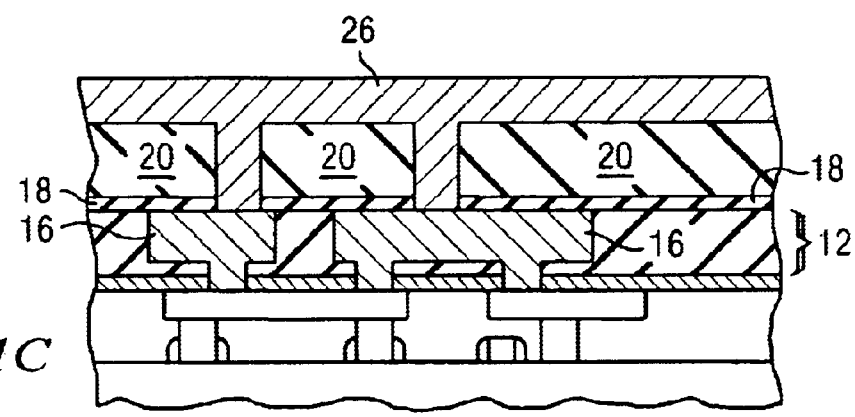
Figure 1D:
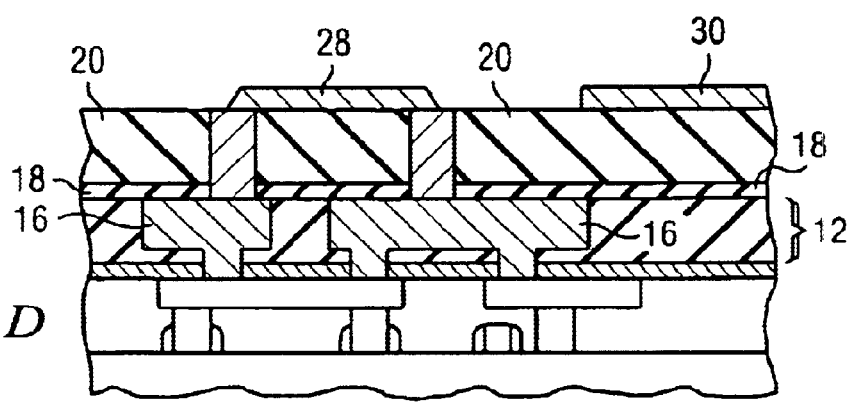

Referring to FIG. 1B, vias 22 are formed in the oxide 20 and the dielectric capping layer 18 using photolithography to connect the last copper level with the top metal (aluminum) level to be formed. The vias are preferably lined with a thin diffusion barrier 24 of titanium, titanium nitride, tantalum, tantalum nitride, tungsten, or tungsten nitride, or the like, formed by sputtering or other appropriate methods. The diffusion barrier prevents inter-diffusion between the copper metal regions and the subsequent metal layers such as aluminum. Additionally, the barrier layer provides an underlayer for the subsequent metal layer. A metal, preferably aluminum or an aluminum alloy, is then deposited to fill the vias 22 as well as to form a metal layer 26 over the oxide 20 (FIG. 1C). The metal layer 26 (referred to as the top or final metal level of the IC) is patterned to form a fusible link 28, a bonding pad 30, and other desired wiring for the circuit design (FIG. 1D).

Alternatively, the filling of the vias 22 and the formation of the top metal layer may be performed in two metallization steps. After the vias 22 are opened in as shown FIG. 1B, a conductive material, such as copper, tungsten, a copper alloy or a tungsten alloy is deposited and etched back to fill the vias. A diffusion barrier is preferably formed over the oxide 20 and the filled vias. A metal, preferably aluminum or aluminum alloy, is then deposited over the oxide layer 20 and patterned to form the fusible links and the bonding pads.

Figure 1E:
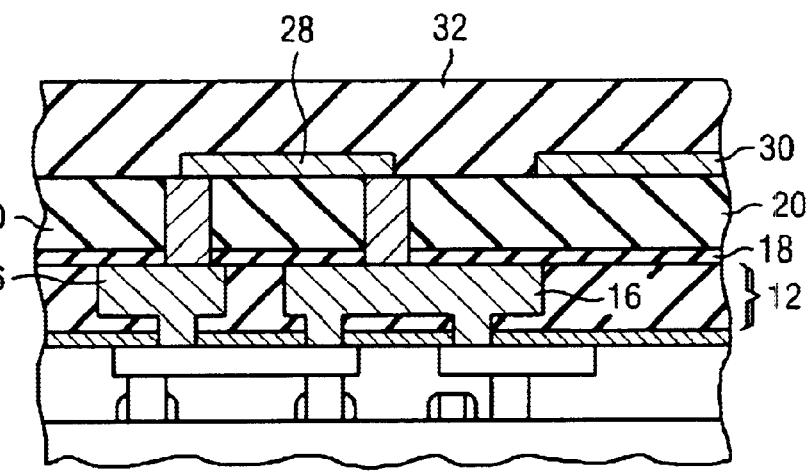
Figure 1F:
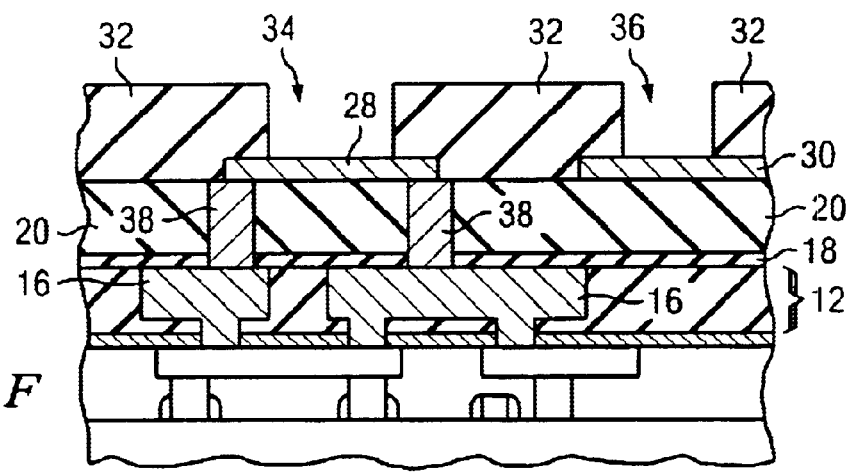

Referring to FIG. 1E, a passivation layer 32 is deposited over the top aluminum layer and the oxide 20. The passivation layer is preferably formed of silicon dioxide, silicon nitride, or silicon oxynitride, and functions to protect the IC and prevent deterioration of its electronic properties through chemical reaction, corrosion or handling during the packaging processes. The passivation layer is patterned to create openings (windows) to the final aluminum layer, such as fuse area opening 34 and bonding pad area opening 36 (FIG. 1F). Patterning is performed using photolithographic techniques and plasma etching or reactive ion etching (RIE) methods, using etchant gases or the like to deepen the opening through the passivation layer. Alternatively, the passivation layer may be patterned with photosensitive polyimides (PSPD). In this manner, portions of the surface defining the fusible link 28 and the bonding pad 30 are exposed. The fuse area opening 34 defines the rupture zone for the fusible link 28. When the fuse is blown, the debris and matter generated is contained within the opening 34.

In the above method, the last etching step to open windows 34 and 36 in the passivation layer 32 presents a challenge in process control. When the window 34 above the fusible link 28 is opened, both the fusible link 28 and the oxide layer 20 in areas surrounding the fusible link will be exposed. Over-etching of the oxide 20 in the surrounding areas may occur, which may lead to exposure of the underlying low k layer and cause oxidation and/or corrosion of the embedded copper metal regions. This problem is particularly severe when the passivation layer is formed of a composite layer of an oxide and a nitride. The removal of the nitride layer typically requires long etch time which increases the risk of over-etching.

Figure 2A:
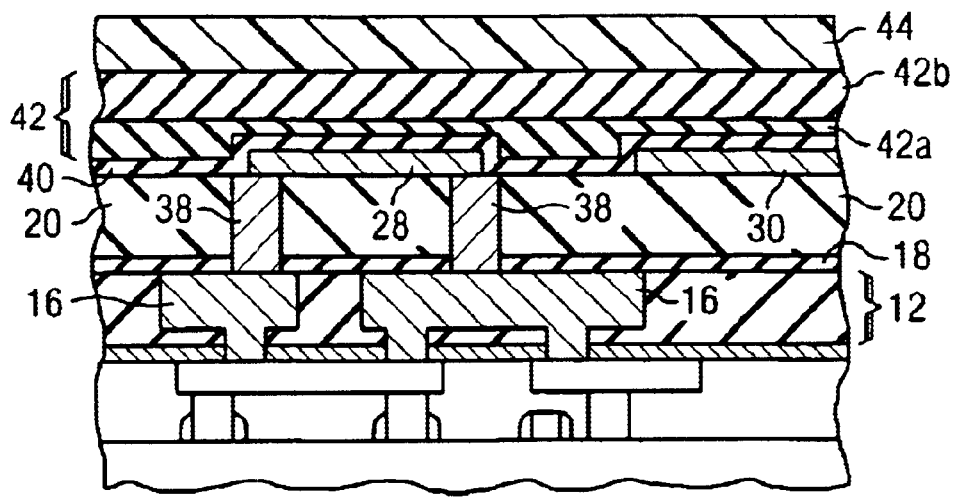
FIGS. 2A and 2B illustrate a process for forming a fuse in an integrated circuit according to an embodiment of the present invention.
Figure 2B:
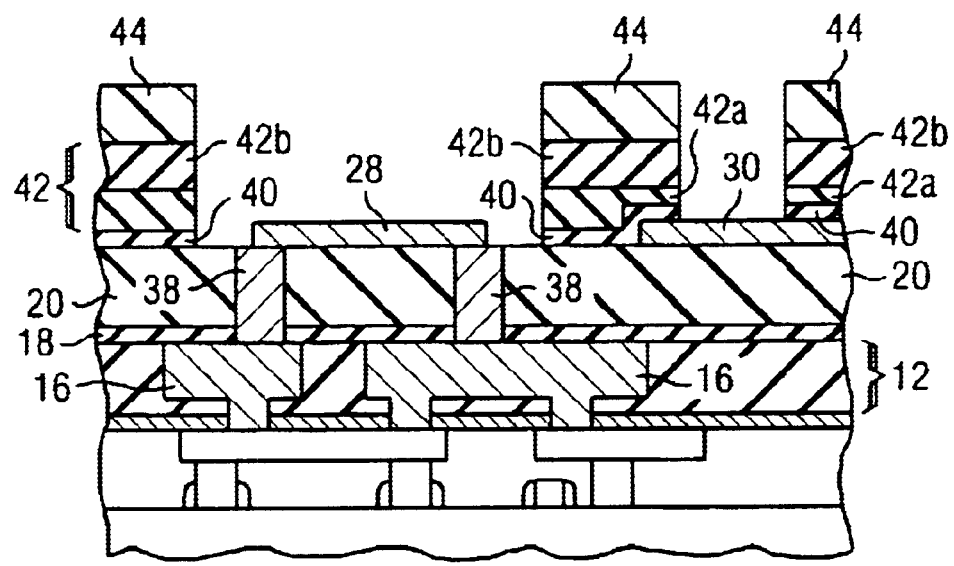

According to embodiments of the present invention, control of the etching process may be improved by forming an etch stop layer over the oxide layer and the top metal (aluminum) layer prior to forming the passivation layer. This method is described with reference to FIGS. 2A and 2B, where the step illustrated in FIG. 2A is performed after the steps illustrated in FIGS. 1A–1D are performed. As shown in FIG. 2A, after the metal (aluminum) patterning step shown in FIG. 1D, a dielectric layer 40 is formed over the oxide layer 20 and the patterned metal layer 28, 30 to act as an etch stop. The dielectric layer 40 may be formed of silicon nitride, silicon carbide, or other suitable material. A passivation layer 42 is formed over the dielectric layer 40. The passivation layer 42 is preferably a composite layer including an oxide layer 42a and a nitride layer 42b. A PSPI layer 44 may be optionally used to pattern the passivation layer. Using photolithography and etching processes, the passivation layer 42 and the etch stop dielectric 40 are removed in areas above the fusible link 28 (including its surrounding areas) and the bonding pad area 30 (FIG. 2B).

Figure 3:
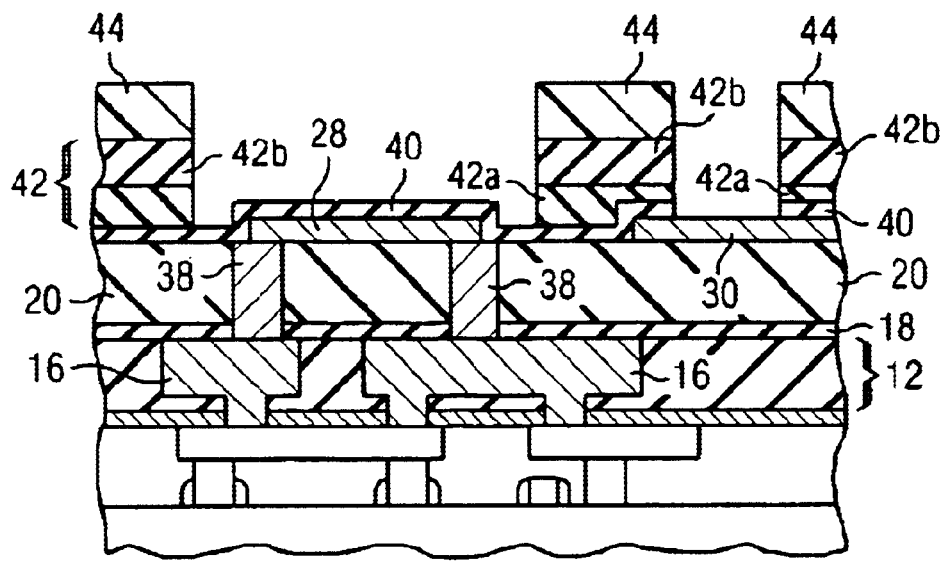
FIG. 3 illustrates a process for forming a fuse in an integrated circuit according to another embodiment of the present invention.

An alternative embodiment of the present invention is shown in FIG. 3, which illustrates steps performed after the step of passivation layer deposition shown in FIG. 2A. According to this method, the passivation layer 42 is removed from above both the fuse area 28 and the bonding pad area 30. The etch stop layer 40, on the other hand, is removed from above the bonding pad area 30 only and not the fuse area 28. This may be accomplished by using an additional mask, where the first mask is used to remove the passivation layer 42 above both the fuse area 28 and the bonding pad area 30, and the second mask is used to selectively remove the dielectric layer 40 above the bonding pad area only. Preserving the etch stop layer 40 over the un-blown fuse protects the fuse from corrosion and enhances device reliability. Alternatively, this approach may be combined with a flip-chip packaging method to eliminate the need for the additional mask. Namely, after the passivation layer 42 is removed above both the fuse are 28 and the pad area 30 using the first mask, the dielectric layer 40 over the pad area 30 is selectively removed by using the same mask that is used for under bump metal patterning in the flip-chip packaging process. Thus, no additional mask is required for the selective removal of the dielectric layer 40.

Figure 4:
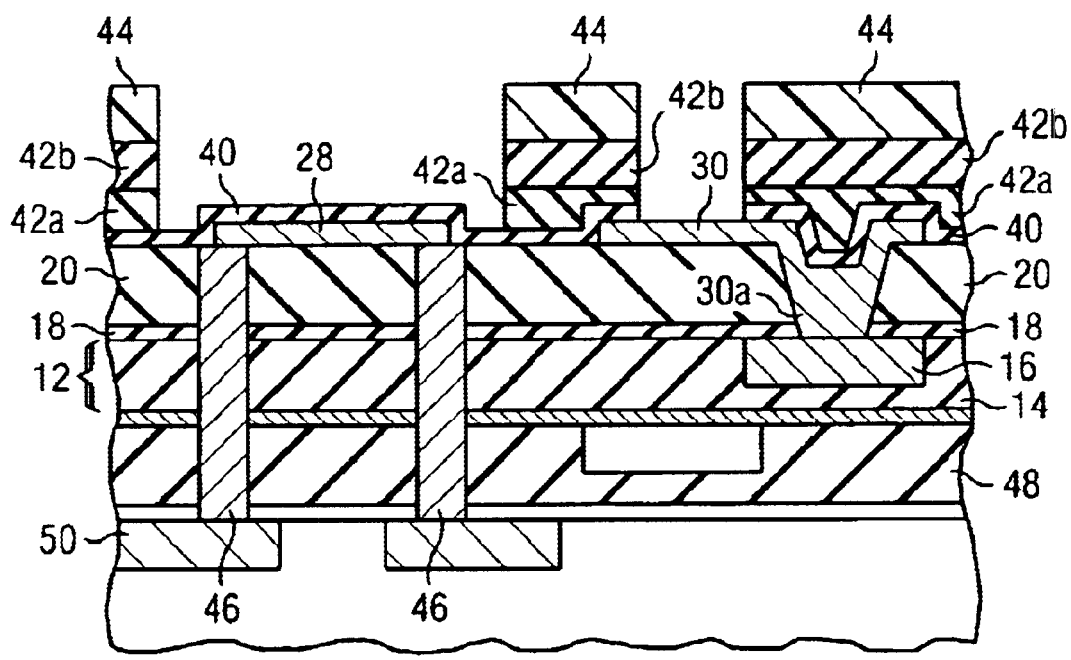
FIG. 4 shows a fuse structure formed using a process according to embodiments of the present invention.

In the embodiments illustrated in FIGS. 1, 2 and 3, the fusible link 28 is shown to connect two conductive plugs 38 (filled vias) that extend through the oxide layer 20 to connect metal wirings 16 in the last copper/low k level 12. The invention is not limited to such a fuse configuration. When desired, the fuse may be constructed to connect wirings at a lower level of the IC. As shown in FIG. 4, this may be done by forming conductive plugs 46 that extend from the surface of the oxide 20 through the oxide and one or more interlayer dielectrics 48 to reach wirings 50 at the lower level. A fusible link 28 over the oxide 20 connects such plugs 46 to form a fuse that electrically connects or disconnects the wirings 50 at the lower level. Segments of the plugs 46 within each dielectric level may be formed when forming metal contacts in that level. The process for forming the last segments of the plugs 46 within the last copper/low k level 12 is preferably the same as that shown in FIGS. 1A–1C. FIG. 4 also shows the bonding pad 30 being connected to the wiring 16 in the last copper/low k level 12 by a plug 30a, which may be formed at the same time the last segments of the plugs 46 are formed.

In summary, the incorporation of the etch stop layer 40 enhances process controllability of the passivation etch step, widens the process window, and reduces or eliminates the risk of over-etching of the oxide layer 20. In addition, the embodiment shown in FIG. 3 provides improved fuse reliability and is flip-chip compatible.

It will be apparent to those skilled in the art that various modifications and variations can be made in a the composition and method of the present invention without departing from the spirit or scope of the invention. For example, the metal wiring patterns shown in the figures are merely exemplary and are not intended to be limiting in any way. In addition, in each of the processing steps, materials and methods other than those specifically described may be suitably used. Thus, is intended that the present invention cover modifications and variations that come within the scope of the appended claims and their equivalents.

What is claimed is:

1. A process for forming a fusible link in an integrated circuit comprising:
   (a) forming a second dielectric layer on a surface of an underlying metal interconnect and a first dielectric layer;
   (b) depositing an oxide layer at a thickness effective to prevent cracking of the oxide layer during a laser fuse process;
   (c) forming a via in the oxide layer and the second dielectric layer extending to the underlying metal interconnect;
   (d) filling the via with a conductive material;
   (e) forming a final metal layer;
   (f) patterning the final metal layer to form a fusible link electrically connected to the via;
   (g) forming a dielectric etch stop layer over the patterned final metal layer and the oxide layer;
   (h) depositing a passivation layer over the dielectric etch stop layer; and
   (i) removing the passivation layer from above at least a portion of the fusible link and a surrounding area.

2. The process of claim 1, further comprising:
   (j) removing the dielectric etch stop layer from above the portion of the fusible link and the surrounding area.

3. The process of claim 1, wherein step (f) further includes patterning the final metal layer to form a bonding pad, and wherein step (i) includes removing the passivation layer form above at least a portion of the bonding pad.

4. The process of claim 3, further comprising:
   (k) removing the dielectric etch stop layer from above the portion of the fusible link and the surrounding area and from above the portion of the bonding pad.

5. The process of claim 4, wherein steps (i) and (k) are performed by photolithography using a single mask.

6. The process of claim 3, further comprising:
   (l) removing the dielectric etch stop layer from above the portion of the bonding pad without removing the dielectric etch stop layer from above the portion of the fusible link and the surrounding area.

7. The process of claim 6, wherein steps (i) and (l) are performed by photolithography using two masks.

8. The process of claim 1, wherein the first dielectric layer is formed of a low k dielectric material.

9. The process of claim 8, wherein the first dielectric layer is formed of SILK®.

10. The process of claim 1, wherein the underlying metal interconnect comprises copper.

11. The process of claim 1, wherein the oxide layer is about 1 micron thick.

12. The process of claim 1, wherein the final metal layer comprises aluminum.

13. The process of claim 1, wherein the final metal layer and the conductive material filling the via comprise aluminum, wherein steps (d) and (e) are performed in one deposition step, and wherein the process further comprises depositing a barrier layer in the via prior to filling the via with aluminum.

14. The process of claim 1, wherein the etch stop layer comprises silicon nitride or silicon carbide.

15. The process of claim 1, wherein the passivation layer comprises at least one material selected from the group consisting of silicon oxide, silicon nitride, and silicon oxynitride.

16. An article of manufacture comprising a semiconductor substrate having an integrated circuit formed therein, the integrated circuit includes a fusible link formed according to the process of claim 1.

17. A process for forming a fusible link in an integrated circuit comprising:
   (a) forming a final metal layer on a semiconductor substrate, wherein the substrate comprises devices fabricated from a copper metal layer and a low k dielectric material;
   (b) patterning the final metal layer to form a fusible link that electrically connects the devices in the integrated circuit;
   (c) forming a dielectric etch stop layer over the patterned final metal layer,
   (d) depositing a passivation layer over the dielectric etch stop layer; and
   (e) removing the passivation layer over at least a portion of the fusible link and a surrounding area.

18. The process of claim 17, further comprising:
   (f) removing the dielectric etch stop layer from above the portion of the fusible link and the surrounding area.

19. The process of claim 17, wherein step (b) further includes patterning the final metal layer to form a bonding pad, and wherein step (e) includes removing the passivation layer form above at least a portion of the bonding pad.

20. The process of claim 19, further comprising:
  (g) removing the dielectric etch stop layer from above the portion of the fusible link and the surrounding area and from above the portion of the bonding pad.

21. The process of claim 20, wherein steps (e) and (g) are performed by photolithography using a single mask.

22. The process of claim 19, further comprising:
  (h) removing the dielectric etch stop layer from above the portion of the bonding pad without removing the dielectric etch stop layer from above the portion of the fusible link and the surrounding area.

23. The process of claim 22, wherein steps (e) and (h) are performed by photolithography using two masks.

24. The process of claim 17, wherein the final metal layer comprises aluminum.

25. The process of claim 17, wherein the etch stop layer comprises silicon nitride or silicon carbide.

26. The process of claim 17, wherein the passivation layer comprises at least one material selected from the group consisting of silicon oxide, silicon nitride, and silicon oxynitride.

27. An article of manufacture comprising a semiconductor substrate having an integrated circuit formed therein, the integrated circuit includes a fusible link formed according to the process of claim 17.

* * * * *